United States Patent [19]
Kaloyeros et al.

[11] Patent Number: 5,968,611
[45] Date of Patent: Oct. 19, 1999

[54] SILICON NITROGEN-BASED FILMS AND METHOD OF MAKING THE SAME

[75] Inventors: Alain E. Kaloyeros, Slingerlands, N.Y.; Barry C. Arkles, Dresher, Pa.

[73] Assignees: The Research Foundation of State University of New York, Albany, N.Y.; Gelest, Inc., Tullytown, Pa.

[21] Appl. No.: 08/979,641

[22] Filed: Nov. 26, 1997

[51] Int. Cl.$^6$ .................................................. C23C 16/34
[52] U.S. Cl. .................. 427/579; 427/585; 427/255.393; 427/255.394; 427/255.7; 438/791; 438/792; 438/793; 438/794
[58] Field of Search ...................................... 427/579, 585, 427/255.1, 255.2, 255.7, 255.393, 255.394; 438/791, 792, 793, 794

[56] References Cited

U.S. PATENT DOCUMENTS

| | | | |
|---|---|---|---|
| 4,200,666 | 4/1980 | Reinberg | 427/39 |
| 5,244,698 | 9/1993 | Ishihara et al. | 427/563 |
| 5,453,305 | 9/1995 | Lee | 427/562 |

OTHER PUBLICATIONS

Beach, D.B., "Infrared and Mass Spectroscopic Study of the Reaction of Silyl Iodide and Ammonia. Infrared Spectrum of Silylamine," *Inorg. Chem.*, vol. 31, No. 20 (1992), pp. 4174–4177. (no month).

Ebsworth, E.A.V., *Volatile Silicon Compounds,* (1963), pp. 101–120. (no month).

Valdes, J.L. et al., "Siliane Alternatives for Silicon IC Manufacturing," 27th International SAMPE Technical Conference, (Oct. 9–12, 1995), pp. 315–327.

Arkles, Barry, "Silicon Nitride from Organosilazane Cyclic and Linear Prepolymers," *Journal of the Electrochemical Society,* vol. 133, No. 1 (1986), pp. 233–234. (no month).

Schuh, Heinz et al., "Disilanyl–amines–Compounds Comprising the Structural Unit Si–Si–N, as Single–Source Precursors for Plasma–Enhanced Chemical Vapour Deposition (PE–CVD) of Silicon Nitride," *Z. anorg. allg. Chem.* 619 (1993), pp. 1347–1352. (no month).

*Primary Examiner*—Timothy Meeks
*Attorney, Agent, or Firm*—Akin, Gump, Strauss, Hauer & Feld, L.L.P.

[57] ABSTRACT

A method for chemical vapor deposition of a silicon-nitrogen based film onto a substrate includes introducing into a deposition chamber: (i) a substrate; (ii) a haloethylsilane precursor in the vapor state; and (iii) at least one nitrogen-containing reactant gas; and maintaining the deposition temperature within the chamber as from about 200° C. to about 1000° C. for a period of time sufficient to deposit a silicon-nitrogen based film on the substrate. Silicon-nitrogen based films are also included which are formed by chemical vapor deposition using a haloethylsilane precursor in a vapor state and at least one reactant gas comprising nitrogen.

17 Claims, No Drawings

SILICON NITROGEN-BASED FILMS AND METHOD OF MAKING THE SAME

BACKGROUND OF THE INVENTION

Flat panel displays and integrated circuit (IC) structures use silicon-nitrogen (Si-N) based thin films for, among other uses, diffuision masks, oxidation barriers and dielectric layers. Current manufacturing technologies for producing these films use the reaction of silicon sources of the type silane ($SiH_4$) or dichlorosilane ($Cl_2SiH_2$) with ammonia ($NH_3$) under thermal or plasma assisted conditions inorganic low-pressure chemical vapor deposition (LPCVD), sub-atmospheric pressure CVD (SACVD), or atmospheric pressure CVD (APCVD). Unfortunately, the thermal required temperatures in excess of 1000° C., while plasma assistance still necessitates temperatures in excess of 750° C.

The use of these inorganic thermal and plasma CVD technologies precludes efficient and safe production of Si-N systems due to the implicit restrictions in thermal budget, with processing temperatures exceeding 750° C., and chemical stability, in view of the safety issues pertaining to the application of silane and similar chemistries. Their use requires stringent safety precautions as they can be pyrophoric, toxic, corrosive, or present other hazards. Plasma use, on the other hand, leads to the incorporation, in many cases, of excessive concentrations of hydrogen species, thus limiting the quality of the resulting Si-N thin films. Also, particulate generation in the CVD reactor, resulting from the reaction of silane-type chemistries with ammonia, poses significant tool reliability problems. Therefore, there is a need in the art for an alternative to use of silane and chlorosilanes as raw materials, and a need in the art for a CVD process which does not require plasma.

Alternatives to inorganic CVD techniques have been proposed, but either require difficult to access intermediates, use a high energy environment and/or result in a film in which the electrical properties are compromised. Examples of such alternative systems include that described in U.S. Pat. No. 4,200,666 using trisilylamine (($SiH)_3N$) and an inert gas with optional ammonia; the system of diethylsilane and ammonia in an LPCVD system at 800° C. as described In A. Hochberg et al., *Mat. Res, Soc. Symp*, 24, 509 (1991); and the system of cyclicsilazanes and ammonia in a chemical vapor deposition (CVD) process as described in B. Arkles, "Silicon Nitride From Organosilazane Cyclic And Linear Prepolymers," *J. Electrochemical Soc.*, Vol. 133, No. 1, pp. 233–234 (1986)

There is a need in the art for a method of producing silicon-nitrogen based thin films, such as ($Sin_x$), where x is greater than zero but less than 2, which can operate below the high temperatures necessary for plasma techniques such that use of plasma is optional, which uses a system pressure preferably near atmospheric pressure (without plasma), which is efficient in throughput, and which eliminates the hazards associated with the use of silane and chlorosilanes as raw materials.

BRIEF SUMMARY OF THE INVENTION

The present invention includes a method for the chemical vapor deposition of a silicon-nitrogen based film onto a substrate, comprising introducing into a deposition chamber (i) a substrate, (ii) a haloethylsilane precursor in a vapor state, and (iii) at least one reactant gas comprising nitrogen. The deposition temperature is maintained within the chamber from about 200° C. to about 1000° C. for a period of time sufficient to deposit a silicon-nitrogen-based film on the substrate.

In one embodiment, the invention includes a method for the chemical vapor deposition of a silicon-nitrogen based film having a formula $Sin_x$, wherein x is greater than 0 and no greater than 2, onto a substrate. The method comprises introducing into a deposition chamber (i) a substrate; (ii) a haloethylsilane precursor in a vapor state and having a formula (I):

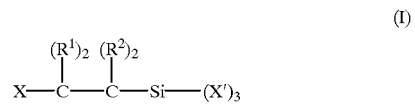

wherein X is a halogen, $R^1$ and $R^2$ are independently selected from the group consisting of hydrogen, and branched or straight chain moieties selected from the group consisting of unsubstituted and halogen-substituted alkyl groups of from 1 to 8 carbon atoms; unsubstituted and halogen-substituted silyl groups of from 1 to 2 silicon atoms; and unsubstituted and halogen-substituted alkylsilyl groups of from 1 to 7 silicon and carbon atoms, and $X^1$ is selected from the group consisting of hydrogen, and halogen; and (iii) at least one reactant gas selected from the group consisting of hydrazine; nitrogen, and ammonia. The deposition temperature is maintained within the chamber from about 450° C. to about 800° C. for a period of time sufficient to deposit a silicon-nitrogen based film on the substrate.

The invention further includes a silicon-nitrogen based film formed by chemical vapor deposition using a haloethylsilane precursor in a vapor state and at least one reactant gas comprising nitrogen

DETAILED DESCRIPTION OF THE INVENTION

The present invention relates to silicon-nitrogen based films formed from haloethylsilane chemical precursors and associated methods for the chemical vapor deposition on various substrates of such films using a nitrogen-containing reactant gas. The method of the invention may deposit such silicon-nitrogen based films as a single film on a substrate, or as one of several layers applied to a substrate forming a multilayered structure. The method of the invention may also deposit multiple layers of varying silicon-to-nitrogen ratios on a substrate, such as in the case when a film consisting of multiple layers of $Sin_x$, with x gradually ranging from well below 1 for the first layer, i.e., a highly silicon-rich layer, to well above 1 for the last surface layer, i.e., a highly nitrogen-rich layer.

As used herein, silicon-nitrogen based films are those films or coatings which contain primarily silicon and nitrogen at varying silicon-to-nitrogen ratios. In one embodiment, such silicon-nitrogen based films are silicon nitride films, typically having the chemical formula $Sin_x$, wherein x is greater than 0 and preferably no greater than 2. Preferably x ranges from about 1.0 to 1.9. While there may be some impurities in the films of the invention, which are residual components from the deposition reactants, such as halogen, hydrogen, carbon and oxygen, it is preferred that the films have very low impurity concentrations, preferably less than 10 at % for hydrogen, 1 at % for carbon, 1 at % for oxygen, and 1 at % for individual residual halogens such as chlorine and bromine.

Such films are useful on substrates such as semiconductor substrates, for example, silicon and gallium arsenide substrates, having sub-micron features and structures. The single or multilayered films can be deposited ex situ in different reactors, or in situ in a single reactor, or a combination thereof. For example, several layers can be deposited in a single reactor and a subsequent layer can be deposited in a separate reactor. When more than one reactor is used, the reactors are preferably interconnected through leak-tight transfer arms and load locks which allow sample transfer between the different reactors without exposing the coated substrate to air. The substrate is preferably formed of, for example, silicon, silicon dioxide, silicon-nitrogen based, or doped versions and mixtures thereof.

The films may also be used in ultra-large scale integration (ULSI) circuitry on substrates with sub-quarter-micron device features. The films are also useful on flat panel display substrates, such as glass, Pyrex, and quartz. According to the CVD processes used in the method of the present invention, single, bilayer or other multilayer films may be placed on the substrates.

Examples of substrates which may be coated include semiconductor substrates as mentioned above, or metal, glass, plastic, or other polymers, for applications including, for example, hard protective coatings for aircraft components and engines, automotive parts and engines and cutting tools; cosmetic coatings for jewelry; and barrier layers and adhesion promoters for flat panel displays and solar cell devices. Preferred metal substrates include aluminum, beryllium, cadmium, cerium, chromium, cobalt, copper, gallium, gold, lead, manganese, molybdenum, nickel, palladium, platinum, rhenium, rhodium, silver, stainless steel, steel, iron, strontium, tin, titanium, tungsten, zinc, zirconium, and alloys and compounds thereof, such as silicides, carbides and the like.

There is really no limitation on the type of substrate which can be used in the present method. However, the substrate is preferably stable at the conditions used for depositing the film or films onto the substrate. That is, the substrate is preferably stable to temperatures of from about 200° C. to about 1000° C., and preferably from about 400° C. to about 800° C., depending on the type of film to be deposited and the intended use of the coated substrate.

The invention uses haloethylsilanes, preferably haloethylsilanes, as precursors along with a nitrogen-containing reactant gas for the formation of silicon-nitrogen based films. It also provides CVD processes which can use different haloethylsilane precursors and nitrogen-containing reactant gases to sequentially deposit silicon-nitrogen based films having differing silicon and nitrogen contents for a particular application. In this respect, it is possible to vary the stoichiometric relation between the silicon and nitrogen in the silicon-nitrogen based film to have differing silicon-to-nitrogen ratios. One possible approach to achieving this goal involves varying either the concentration ratio of Si source to ammonia in the CVD reaction, or substrate temperature, or both during the deposition process. Another approach requires changing the type of Si source used during the deposition process, or the nature of the nitrogen-containing reactant gas. This could result in single, bilayer or other multilayer films with varying silicon-to-nitrogen ratios. This approach allows the deposition, for example, of a film having multiple layers of $Si_{n_x}$, with x gradually ranging from well below 1 for the first layer, i.e., a silicon-rich layer, to well above 1 for the last surface layer, i.e., a nitrogen rich layer.

In the method, a haloethylsilane precursor in the vapor state is introduced into a deposition chamber having a substrate, along with at least one reactant gas. Preferably, a carrier gas is also used. However, the carrier and the reactant gas may be the same, i.e., a nitrogen-containing carrier gas, such as ammonia, may be introduced along with the precursor, in which case the ammonia functions both as a reactant gas and carrier gas. A gas such as ammonia can also be introduced as a carrier/reactant gas with the precursor and a separate feed of nitrogen-containing reactant gas may also be fed into the chamber. In addition, an inert gas (or mixture of inert gas and nitrogen-containing gas) may function as a carrier with a separate feed of nitrogen-containing reactant gas. For convenience purposes, the gas used to help direct the precursor to the substrate in the chamber will be referred to generally herein as a "carrier" gas even though it may also be the reactant gas.

Although for convenience purposes, the gas(es) discussed herein are referred to as "carrier" gas(es) or "reactant" gas(es), the function of these gases should not be misconstrued. In fact, in addition to carrying the vapor of the source precursor into the reaction chamber, the carrier gas may also undergo reaction in the chamber during the deposition process. Also, a so-called "reactant" gas as introduced may include inert components, in which case some or all of the reactant gas may serve merely to dilute the reactive atmosphere inside the deposition chamber. Likewise, the carrier gas may include inert components.

In one preferred embodiment for the preparation of silicon-nitrogen based films, by plasma-promoted CVD, a nitrogen-containing reactant gas must be introduced into the chamber. Reactant gases comprising nitrogen include, for example, nitrogen, ammonia, hydrazine, and nitrous oxide. Nitrogen, ammonia, hydrazine and nitrous oxide are preferred nitrogen-containing reactant gases according to the invention. The nitrogen-containg reactant gas may function as a carrier and a nitrogen-containing reactant gas, and hydrogen or an inert gas such as argon or xenon may also be introduced simultaneously as the at least one carrier therewith functioning either as part of the a carrier and/or a reactant gas. Nitrogen and/or an inert gas may also be co-introduced as a combined reactant/carrier gas.

The precursor preferably has the following formula:

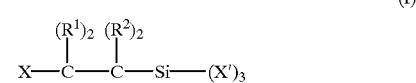

(I)

wherein X is a halogen, for example, chlorine, bromine, iodine, or fluorine. $R^1$ and $R^2$ may be the same or different. Further, while there are two $R^1$ and $R^2$ groups on each carbon atom, on a given carbon atom, the $R^1$ or $R^2$ groups may be different. As such, $R^1$ and $R^2$ are preferably independently selected from the group consisting of hydrogen, and branched or straight chain moieties selected from the group consisting of unsubstituted and halogen-substituted alllyl groups of from 1 to 8 carbon atoms; unsubstituted and halogen-substituted silyl groups of from 1 to 2 silicon atoms; and unsubstituted and halogen-substituted alkylsilyl groups of from 1 to 7 silicon and carbon atoms. X' is preferably hydrogen or halogen such that $Si(X')_3$ may be —$SiH_3$,—$SiX_3$,—$SiX_2H$, or —$SiXH_2$.

Preferred compounds are haloethylsilane precursors such as 2-chloroethylsilane, 2-bromoethylsilane, 2-chloropropylsilane, 1-chloro-1,2-disilylethane, 2-bromoethyltrichlorosilane, 2-iodoethyltriiodosilane, and 2-chloroethylchlorosilane, although it is also contemplated to be within the scope of the invention to use as precursors other similar compounds, or compounds such as those of formula (I) which have further substituted or functionalized groups which do not materially affect the reaction of the precursor and reaction gas for formation of silicon- and nitrogen-rich films.

If a carrier gas is used, it may be a single gas or gaseous mixture. The carrier gas(es) is preferably an inert gas such as the noble gases argon, krypton, neon, and/or xenon. However, the carrier gas(es) may also be hydrogen; helium; halogens such as fluorine and/or chlorine; and/or nitrogen-containing gases such as nitrogen, ammonia, hydrazine and nitrous oxide. The carrier gas(es) can be varied depending upon the type of film to be formed. For example, for forming a silicon-nitrogen based film having a larger nitrogen concentration, that is, $SiN_x$ wherein x is greater than 1, a nitrogen-containing gas is a preferred carrier gas. For forming a stoichiometric silicon-nitrogen based film or a silicon-rich silicon-nitrogen based film, that is, $SiN_x$ wherein x is greater than 0 and less than or equal to 1, hydrogen or inert gases are preferred. Most preferably, the carrier gas is nitrogen and/or an inert gas.

The reactant gas may be a single nitrogen-containing gas, or mixture of nitrogen-containing gases, for example, nitrogen, ammonia, hydrazine and/or nitrous oxide. Most preferably, the reactant gas is ammonia. The reactant gas may be introduced with, or as, the carrier gas(es), or may be introduced separately into the chamber. The reactant gas may be a pure reactant gas or combined with an inert gas.

The chamber is operated at a deposition temperature of from about 200° C. to about 1000° C., preferably from about 450° C. to about 800° C., and most preferably from about 600° C. to about 800° C. The source precursor, the carrier gas(es), and the reactant gas(es) are introduced to the chamber having a substrate to be coated. The processing pressure is typically maintained within the chamber from about 0.20 torr to about 1000 torr, and preferably from about 0.5 torr to about 750 torr.

Optionally, a plasma may be introduced to the reaction to use a plasma-assisted CVD, however, plasma is not necessary to the CVD reaction of the present invention. If plasma is used, it is preferred that the plasma have a plasma power density of from about 0.01 to about 10 $W/cm^2$ and a frequency of from about 0 Hz to about $10^8$ kHz. An electrical bias may also be applied to the substrate. The corresponding power density preferably ranges from greater than 0 $W/cm^2$ to $10^3$ $W/cm^2$, preferably about 0.001 $W/cm^2$ to $10^3$ $W/cm^2$.

The materials introduced to the chamber are maintained under the reaction conditions for a period of time sufficient to deposit a silicon-nitrogen based film onto the substrate. The deposition step typically takes from about 30 seconds to about 30 minutes, most preferably about 5 minutes, but the time is dependent upon the type of film to be deposited, the processing conditions, the desired film thickness and the reactant and/or carrier gas and precursor employed.

Without wishing to be bound, it is believed that the reaction mechanism which results in the deposition of silicon-nitrogen based films involves thermally displacing or eliminating the unsaturated group, such as the —$CH_2CH_2$— group, in the haloethylsilane precursor, to allow a low-temperature, thermal conversion to form the intermediate halosilane compound. The intermediate retains an amine nitrogen which allows the formation, in the presence of the ammonia or other nitrogen-containing reaction gases, of an unstable silicon-nitrogen intermediate compound such as a primary or secondary silylamine that can transport without particle formation. A halogenated nitrogen-containing by-product, such as ammonium chloride is yielded and the unstable intermediate, formed in the CVD environment, facilitates formation of the silicon-nitrogen based film. The mechanism of decomposition of the unstable intermediates in the CVD environment to silicon-nitrogen-based film is not fully understood, but it is believed to be possible that intermediate silylimine having a Si=N bond may be involved. An example of proposed reaction mechanisms using preferred precursors and reaction gases are included below for chloroethylsilane (II) and for bromoethyltrichlorosilane (III):

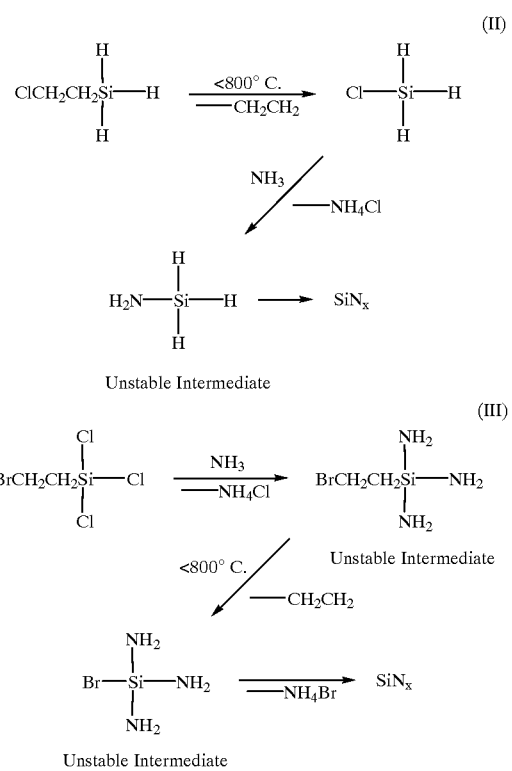

Alternating or sequentially deposited multilayers of silicon-nitrogen based films and/or other semiconductor films, including further silicon-nitrogen based films, may be provided to the substrate preferably while the substrate is kept in a single deposition reactor. The substrate and precursor are provided to the deposition chamber, with the precursor being in the vapor state. The preferred gas is then provided for forming alternating or sequential film layers at the preferred deposition chamber temperatures as noted above. Either the silicon-nitrogen based film or another film used in the semiconductor, for example, tantalum-based, titanium-based, or silicon-based films, can be deposited first onto the substrate and the various layers then can be alternated or applied in any given order or sequence.

Alternatively, such multiple layers of silicon-nitrogen based films can be deposited on a substrate while the substrate is moved within the single deposition reactor. Further, the multiple layers can be provided to the substrate while the substrate is moved between two or more separate reactors, each used for deposition of one or more of the layers depending upon the particular application of the coated substrate. The substrate is moved from one reactor, where one or more such layer is deposited, to another reactor(s), where additional layer(s) are deposited. Preferably, the reactors are interconnected through leak-tight transfer arms and/or load locks which allow sample transfer between the different reactors without exposing the coated substrate to air.

To prepare the silicon-nitrogen based films according to the present invention, any CVD apparatus having the general criteria discussed below, with or without optional plasma, may be used. The reactants are introduced into the CVD reactor in gaseous form, and the precursor in the vapor state. The energy necessary for bond cleavage and chemical reaction is supplied by thermal energy. "Plasma-promoted CVD" refers to an LPCVD process wherein additional energy necessary for bond cleavage and chemical reaction is supplied in part by the high energy electrons formed in a glow discharge in the form of plasma preferably having a plasma power density of from about 0 to about 100 W/cm$^2$, more preferably from about 0.01 to about 10 W/cm$^2$, and most preferably below 0.5 W/cm$^2$. Plasma-promoted CVD takes advantage of the high energy electrons present in glow discharges to assist in the dissociation of gaseous molecules. Preferred use of the low power densities employed in plasma-promoted CVD in the present invention do not cause premature precursor decomposition in the gas phase, thus preventing undesirable film contamination. Additionally, the use of a low power plasma density aids in preventing electrical damage to the film and substrate.

Any CVD reactor having the following basic components may be used with the method of the present invention: a precursor delivery system which is used to store and control the delivery of the precursor, a vacuum chamber, a pumping system to maintain an appropriately reduced pressure, a power supply to create the plasma discharge for plasma-promoted CVD if plasma is to be used, a temperature control system, and gas or vapor handling capability to meter and control the flow of reactants and products resulting from the process. The precursor delivery system may be any of the following: a pressure-based bubbler or sublimator, a hot-source mass flow controller, a liquid delivery system, or a direct liquid injection system or similar apparatus.

In depositing silicon-nitrogen based films according to the present invention, the haloethylsilane precursor is preferably placed in a reservoir which could be heated by a combination of resistance heating tape and associated power supply to a temperature which is high enough to ensure the precursor's sublimation or vaporization, but not so high as to cause premature decomposition of the precursor. A mass flow controller, which may be isolated from the reservoir by a high vacuum valve, is preferably provided to help control gas flow into the reservoir. The carrier and/or reactant gas, for example, nitrogen, ammonia or a combination of nitrogen and ammonia, may function as a carrier and/or reactant gas when a conventional pressure- and/or temperature-based mass flow control delivery system is used as a delivery isystem for precursor into the CVD reactor chamber. Alternatively, such gases may function as pressurizing agents when using a liquid delivery system for the delivery of the precursor to the CVD reactor. Such a system may include a combination micropump and vaporizer head. A suitable example of such a system is the MKS Direct Liquid Injection system. A further example of a suitable delivery system for the source precursor is a hot source mass flow controller, for example, an MKS Model 1150 MFC, which does not require the use of a carrier or pressurizing gas. A further example is a solid source delivery system, for example, the MKS 1153 system, which does not require the use of a carrier or pressurizing gas.

In a preferred embodiment, the precursor vapor and carrier and/or reactant gas are preferably transported into the CVD reactor through delivery lines which are maintained at the same temperature as the reservoir, using a combination of resistance heating tape and an associated power supply, to prevent precursor recondensation. The CVD reactor may be an eight-inch wafer, cold-wall, stainless steel CVD reactor preferably equipped with plasma generation capability. The plasma may be generated by various sources, such as direct current plasma, radio frequency plasma, low frequency plasma, high density plasma, electron cyclotron plasma, inductively coupled plasma, microwave plasma or other similar sources. The plasma may be used for dual purposes. It may be used for in situ pre-deposition substrate cleaning, and for actual deposition if using plasma-promoted CVD is used.

The reactor may also be equipped with an electrical bias on the substrate. The bias can be derived from direct current, a low radio frequency of less than 500 kHz, a high radio frequency of from 500 kHz to about 10$^6$ kHz, or a microwave frequency of from about 10$^6$ kHz to about 10$^8$ kHz and similar sources.

While the reactor may be operated at near atmospheric pressure, partial evacuation of the CVD deposition reactor to draw the gases and precursor into the chamber to facilitate reaction is possible using various pumping systems. Two such systems are preferred. One system is a high vacuum (10$^{-6}$ torr or more) pumping system, which may use either a cryogenic- or turbomolecular-type pump. This system ensures a high vacuum base pressure in the reactor. A vacuum system having a roots blower or dry pump may also be used for handling the high gas throughput during CVD runs. Both pumping units are preferably isolated from the CVD reactor by high vacuum gate valves.

The CVD reactor is preferably equipped with a high vacuum load-lock system which is used for transporting and loading substrates as large as about 300 mm wafers or larger into the reactor. Alternatively, the reactor may interface with a vacuum central handler unit which may be used to transfer the substrate between multiple CVD reactors to deposit sequential or alternating layers of silicon-nitrogen based films of varying silicon-to-nitrogen ratios.

After being charged to the reservoir, the precursor is maintained at a temperature which ensures its high rate sublimation or vaporization into the CVD chamber, but not so high as to cause its premature decomposition. Preferably, the precursor is maintained at a temperature of from about 25° C. to about 150° C. When conventional pressure- and/or temperature-based mass flow control type or a solid-source-type delivery systems are used to control the flow of precursor into the CVD reactor, the temperature of precursor in the reservoir plays a key role in controlling its rate of delivery into the chamber. Alternatively, when a liquid delivery system is used, for example, the MKS Direct Liquid Injection system consisting of a combination micropump and vaporizer head, the liquid in the reservoir is room temperature. In such a liquid delivery system, the vaporizer head, not the liquid in the reservoir, is heated to a temperature which is high enough to ensure the precursor's sublimation or vaporization, but not so high as to cause its premature decomposition.

When a gas is used for delivery, any gaseous substance may be used which is substantially not reactive with the precursor or which reacts with the precursor to form an intermediate product which is more easily transported to the reaction zone and/or could more readily decompose to yield the desired silicon-nitrogen based film. Exemplary carrier gases are listed above. The flow rate of carrier gas may vary from greater than 0 to about 100 standard 1/min, and preferably from about 10 to about 1000 cm$^3$/min.

In all modes of delivery described above, the flow rate of the vapor of the precursor could range from about 0.01 to about 2000 standard cm³/min. Preferably the flow rate of precursor vapor into the CVD chamber is from about 0.1 to about 100 standard cm³/min. The flow of carrier and/or reactant gas, which may be a single gas or a mixtures of gases, is preferably from about 10 standard cm³/min to about 100 standard 1/min, and more preferably from about 100 standard cm³/min to about 5 standard 1/min. The corresponding reactor pressure is preferably about 0.20 torr to about 1000 torr, and more preferably from about 0.5 torr to about 750 torr.

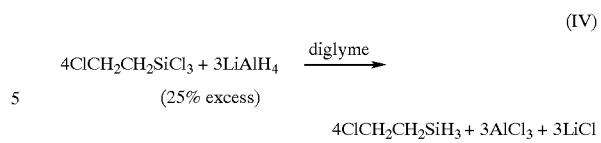

(IV)

The reactants and compounds have the following properties as shown in Table 1:

TABLE 1

| Property | 2-chloroethyl-trichlorosilane | LiAlH₄ | 2-chloroethyl-silane | diglyme | AlCl₃ | LiCl |
|---|---|---|---|---|---|---|
| Molecular Weight | 197.95 | 37.95 | 94.6 | 134.18 | 133.34 | 42.39 |
| Boiling Point | 152–3° C. | — | 69–71° C. (observed) | 162° C. | — | — |
| Specific Gravity | 1.419 | 0.917 | 0.904 (observed) | 0.954 | 2.44 | 2.068 |

Regardless of the exact CVD process used to prepare the silicon-nitrogen based film, and regardless of the exact identities of the nitrogen-containing reactant gas and the at least one carrier gas which can function as a carrier and/or reactant gas, if a stoichiometric $Si_3N_4$ film is desired, at least 4 moles of nitrogen atoms should be present in the reaction chamber for each three moles of silicon. If less than a stoichiometric amount of nitrogen is present in the deposition chamber, then a silicon-rich film, such as $Sin_x$, where x <1, will be deposited. This could allow the formation of a mixed phase film, i.e., a film having phases of pure silicon and silicon-rich nitrides. A mixed phase film might be preferred for some applications, and methodology to prepare such films and substrates having these films coated thereon is within the scope of the invention.

Additionally, it is important to maintain an excess of nitrogen atoms, i.e., more than one mole of nitrogen atoms in the reaction chamber for each mole of silicon in the reaction chamber, if a nitrogen-rich film is desired. If excess nitrogen is present in the deposition chamber, then a nitrogen-rich film, such as $SiN_x$, where x>1, will be deposited. This also could allow the formation of a mixed phase film, i.e., a film having phases of pure silicon and nitrogen-rich nitride.

It should also be understood, based on the disclosure, that any suitable CVD technology for preparing silicon-nitrogen based films, alone or in combination, may be used in accordance with the method of the present invention. For example, standard CVD may be used to deposit a silicon-nitrogen based film, followed by use of plasma-promoted CVD to deposit a second such film with a different silicon-to-nitrogen compositional ratio (or a different type of semiconductor film) to form a bilayer or, with additional layers, a multilayered film on a substrate.

The invention will now be further illustrated in accordance with the following non-limiting examples:

EXAMPLE 1

Prior to forming a silicon-nitrogen based film, 2-chloroethylsilane was prepared in accordance with the following reaction:

A 5-liter, 4-necked flask, equipped with a nitrogen protected condenser, an addition funnel, pot thermometer and mechanical stirrer, was placed in a cooling bath, and charged with 3 l of diglyme. Lithium aluminum hydride in an amount of 189.8 g was added slowly, and stirred from three to four hours. The mixture was cooled to 15° C., and 2-chlorethyltrichlorosilane in an amount of 989.8 g was slowly added while maintaining the temperature at from 25° C. The addition was completed over five hours. The reaction mixture was stirred overnight. The addition funnels and condensers were removed and replaced with a take-off into a dry-ice-cooled one-liter flask equipped with a dewar condenser. The cooling bath to the reaction flask was replaced with a heating mantle.

Under a partial vacuum of 50 torr, volatiles were removed from the reaction flask and condensed in the one-liter flask. At the end of the strip, the vacuum was increased to 25 torr and temperature was increased to 40° C. The volatile fraction that condensed in the one-liter flask was distilled at atmospheric pressure. The main cut boiled at 71° C., and weighed 265 g, for a yield of 56%. Identity of 2-chloroethylsilane was confirmed by infrared (IR) spectroscopy and nuclear magnetic resonance (NMR) spectroscopy. The product was a clear liquid which was stable in air, with a specific gravity at 20° C. of 0.904.

The 2-chloroethylsilane was then used as a precursor for depositing a silicon-nitrogen based film using CVD. After loading the substrate, the CVD reaction chamber was evacuated, and then back-filled with nitrogen. During the deposition, the pressure of the CVD reactor was held at 750 torr. The substrates used were 2.54 cm×2.54 cm silicon pieces. They were attached to a 15.24 cm carrier wafer with silver paint. The wafer rested on a quartz plate which was heated by a ceramic heater. The heater temperature was measured with three thermocouples from underneath the heater. Each thermocouple was connected to a temperature controller. The actual temperature was determined by using a calibration wafer. The difference between the heater temperature and the wafer temperature was dependent on the rate of gas flow, and the values of the heater temperature and cone temperature. For the process conditions given in this example, the wafer temperature was 80–100° C. lower than the heater temperature.

The 2-chloroethylsilane was added in an amount of 5 ml to a bubbler. The bubbler temperature was maintained at 15°

C. using a cooled water bath. Nitrogen was used as a carrier gas. The precursor vapor and carrier gas entered the reaction chamber at the center of a cone-shaped showerhead, which was located above the substrate. The diameter of the bottom of the showerhead cone was 5.08 cm. Ammonia was used as the reactant gas, and entered the chamber through a separate inlet which was also connected to the showerhead cone, but was located off-center. The cone temperature was held at 500° C. Typical deposition times were 5 min. Several depositions were performed without reloading the bubbler.

Deposition of silicon-nitrogen films was achieved at temperatures from 600° C. to 800° C. Film analysis was performed using Rutherford backscattering spectroscopy (RBS), Auger electron spectroscopy (AES) and nuclear reaction analysis (NRA). The N:Si ratio ranged from 1.5 to 1.7 as measured by RBS and AES. Lowest impurity levels in the process window investigated were determined by AES to be 2–3 at % for oxygen, and 2–8 at % for carbon. Using NRA, hydrogen concentrations were found to be between 15–17%. RBS showed chlorine impurities of 0.4–2.4 at %. Growth rates ranged from 55–200 Å/min and increased with growth temperature.

Summaries of the information from each such deposition are shown in Table 2.

EXAMPLE 2

Using 2-bromoethyltrichlorosilane, the same procedure as described in Example 1 for deposition was used, including the same conditions, with the exception that a higher precursor temperature was necessary to provide sufficient vapor pressure for the 2-bromoethyltrichlorosilane. The bubbler temperature was set to 85° C. and the precursor delivery lines were maintained at a temperature at least 20° C. higher than the bubbler temperature. Deposition of the silicon-nitrogen based films was achieved at heater temperatures from 550° C. to 800° C. Film analysis was performed using RBS, Fourier transform infrared spectroscopy (FT-IR) and NRA. The N:Si ratio ranged from 1.5 to 1.9 as measured by RBS. Si—N and N—H bonds were identified by FT-IR. Using NRA, hydrogen concentrations were found to be 18–22 at %. RBS showed chlorine impurities of 1.4–2.0 at % and bromine impurities of 0.3–0.6 at %. Growth rates ranged from 30–550 Å/min and increased with growth temperature.

In contrast to prior art chemical vapor deposition methods for forming silicon-nitrogen based films, the method of the present invention provides films with electronic grade purity and low levels of contamination at lower temperatures than provided in the prior art. It further provides a safe alternative to use of hazardous silane and chlorosilane raw materials. Further, the ability to form the films without the use of plasma, provides an efficient, lower temperature and lower energy alternative to prior art processes.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for the chemical vapor deposition of a silicon-nitrogen based film onto a substrate, comprising
   (a) introducing into a deposition chamber:
      (i) a substrate;
      (ii) a haloethylsilane precursor in a vapor state and having formula (I):

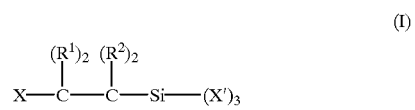

(I)

wherein X is a halogen, $R^1$ and $R^2$ are independently selected from the group hydrogen, and branched or straight chain moieties selected from the consisting of unsubstituted and halogen-substituted alkyl groups of from 1 to 8 carbon atoms; unsubstituted and halogen-substituted silyl groups of from 1 to 2 silicon atoms, and unsubstituted and halogen-substituted alkylsilyl groups of from 1 to 7 atoms total of silicon and carbon and X' is selected from the group consisting of hydrogen and halogen; and
      (iii) at least one reactant gas comprising nitrogen; and
   (b) maintaining a deposition temperature within said chamber of from about 200° C. to about 1000° C. for a period of time sufficient to deposit a silicon-nitrogen based film on said substrate.

2. The method according to claim 1, wherein said silicon-nitrogen based film is represented by the formula $Si_N$, wherein x is greater than 0 and less than 2.

TABLE 2

| Run No. | Heater Temp. (° C.) | Precursor Amount (ml) | Deposition Time (min) | Bubbler Temp. (° C.) | Nitrogen Flow Rate (standard l/min) | Ammonia Flow Rate (standard (l/min) | Ratio of Si:N:O:C Concentrations in Film |
|---|---|---|---|---|---|---|---|
| 18 | 550 | 1.0 | 16 | 0–26 | 0.2 | 2.0 | no deposition |
| 19 | 450 | 0.5 | 4 | 15 | 0.0–0.2 | 2.0 | no deposition |
| 22 | 800 | 1.5 | 12 | 15 | 0.2 | 2 | 35:60:2:2 |
| 25 | 700 | 1.0 | 26 | 15 | 0.2 | 2 | 35:58:2:4 |
| 27 | 700 | 1.5 | 21 | 15 | 0.2 | 2 | 35:59:2:3 |
| 29 | 650 | 1.6 | 17 | 15 | 0.2 | 0.5 | 34:55:3:8 |
| 30 | 600 | 0.3 | 4 | 15 | 0.2 | 0.5 | 35:53:9:5 |
| 31 | 650 | 1.0 | 38 | 37–76 | 0.2 | 0.5 | 26:52:16:5 |
| 32 | 650 | 2.0 | 20 | 15 | 0.2 | 0.46 | 24:48:13:12 |
| 33 | 600 | 1.5 | 15 | 15 | 0.2 | 0.5 | 25:50:12:13 |
| 35 | 650 | 1.8 | 13 | 15 | 0.2 | 0.5 | 28:50:8:12 |
| 40 | 700 | 3 | 1 | 15 | 0.2 | 0.5 | 35:55:2:10 |

3. The method according to claim 1, wherein said haloethylsilane precursor is selected from the group consisting of 2-chloroethylsilane, 2-bromoethylsilane, 2-chloropropylsilane, 1-chloro-1,2 disilylethane, 2-bromoethyltrichlorosilane, 2-iodoethyltriiodosilane, and 2-chloroethylchlorosilane.

4. The method according to claim 1, wherein at least one carrier gas is introduced to the chamber along with the haloethylsilane precursor, said at least one carrier gas being selected from the group consisting of hydrogen, helium, fluorine, neon, chlorine, argon, krypton, xenon, nitrogen-containing gases, silane, oxygen-containing gases, and water vapor.

5. The method according to claim 4, wherein said at least one carrier gas is nitrogen.

6. The method according to claim 4, wherein a flow rate of said at least one carrier gas is greater than 0 and no greater than about 100 l/min.

7. The method according to claim 1, wherein said reactant gas is selected from the group consisting of ammonia, nitrogen, hydrazine, and nitrous oxide.

8. The method according to claim 7, wherein said reactant gas is ammonia.

9. The method according to claim 1, further comprising introducing into said chamber a plasma having a plasma power density of from about 0.01 W/cm$^2$ to about 10 W/cm$^2$ and a frequency of from about 0 Hz to about $10^8$ kHz for a period of time sufficient to deposit the silicon-nitrogen based film on the substrate.

10. The method according to claim 1, further comprising applying to said substrate an electrical bias having a power density greater than 0 Watts/cm$^2$ and less than or equal to about $10^3$ Watts/cm$^2$, wherein said electrical bias is at least one of a direct current bias, a low radio frequency bias of less than 500 kHz, a high radio frequency bias of from 500 kHz to $10^6$ kHz, or a microwave frequency bias of from $10^6$ kHz to about $10^8$ kHz bias.

11. The method according to claim 1, wherein a pressure in said chamber during said deposition is from 0.30 torr to about 1000 torr.

12. The method according to claim 1, wherein said substrate comprises a material selected from the group consisting of metal, silicon, glass, and polymer.

13. The method according to claim 1, wherein said substrate is selected from the group consisting of aluminum, beryllium, cadmium, cerium, chromium, cobalt, copper, gallium, gold, iron, lead, manganese, molybdenum, nickel, palladium, platinum, rhenium, rhodium, silver, steel, strontium, tin, titanium, tungsten, zinc, zirconium, alloys thereof, and compounds thereof.

14. The method according to claim 1, wherein said deposition temperature within said chamber is maintained from about 450° C. to about 800° C.

15. The method according to claim 14, wherein said deposition temperature within said chamber is maintained from about 700° C. to about 800° C.

16. The method according to claim 1, further comprising:
(c) depositing a second film on said film deposited on said substrate for forming a multilayered structure while said substrate remains fixed in said chamber.

17. A method for the chemical vapor deposition of a silicon-nitrogen based film having a formula $SiN_x$, wherein x is greater than 0 and no greater than 2, onto a substrate, comprising:
(a) introducing into a deposition chamber:
 (i) a substrate;
 (ii) a haloethylsilane precursor in a vapor state and having a formula (I):

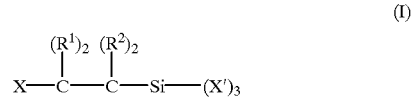

wherein X is a halogen, $R^1$ and $R^2$ are independently selected from the group consisting of hydrogen, and branched or straight chain moieties selected from the group consisting of unsubstituted and halogen-substituted alkyl groups of from 1 to 8 carbon atoms; unsubstituted and halogen-substituted silyl groups of from 1 to 2 silicon atoms; and unsubstituted and halogen-substituted alkylsilyl groups of from 1 to 7 atoms total of silicon and carbon, and X' is selected from the group consisting of hydrogen and halogen; and
 (iii) at least one reactant gas comprising nitrogen and selected from the group consisting of hydrazine, nitrogen, ammonia, and nitrous oxide; and
(b) maintaining a deposition temperature within said chamber of from about 450° C. to about 800° C. for a period of time sufficient to deposit a silicon-nitrogen based film on said substrate.

* * * * *